US012712327B2

(12) United States Patent
Sulyman et al.

(10) Patent No.: US 12,712,327 B2
(45) Date of Patent: Aug. 18, 2026

(54) ELECTRICAL FEEDTHROUGH CONNECTOR FOR A SUBSTRATE SUPPORT ASSEMBLY

(71) Applicant: Applied Materials, Inc., Santa Clara, CA (US)

(72) Inventors: Alexander Sulyman, Santa Clara, CA (US); Jaeyong Cho, San Jose, CA (US); Stephen Donald Prouty, San Jose, CA (US); Andrew Antoine Noujaim, Morgan Hill, CA (US); Martin Perez Guzman, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 85 days.

(21) Appl. No.: 18/632,053

(22) Filed: Apr. 10, 2024

(65) Prior Publication Data

US 2025/0323463 A1 Oct. 16, 2025

(51) Int. Cl.
*H01R 31/06* (2006.01)
*H01J 37/32* (2006.01)
*H02N 13/00* (2006.01)

(52) U.S. Cl.
CPC ........ *H01R 31/06* (2013.01); *H01J 37/32715* (2013.01); *H02N 13/00* (2013.01); *H01J 2237/2007* (2013.01)

(58) Field of Classification Search
CPC ................ H01R 31/06; H01J 37/32715; H01J 2237/2007; H01J 37/32577; H02N 13/00
USPC .......................................................... 361/234
See application file for complete search history.

(56) References Cited

U.S. PATENT DOCUMENTS 4,922,323 A 5/1990 Potter
6,255,601 B1 * 7/2001 Burkhart ............... H10W 70/05 174/262
2016/0225652 A1 8/2016 Tran et al.
2021/0343512 A1 * 11/2021 Parkhe .............. H01J 37/32082
2021/0375599 A1 * 12/2021 Noujaim ........... H01J 37/32577
(Continued)

OTHER PUBLICATIONS

International Search Report and Written Opinion for Application No. PCT/US2025/019417 dated Jun. 25, 2025.

*Primary Examiner* — Sreeya Sreevatsa
(74) *Attorney, Agent, or Firm* — Patterson + Sheridan, LLP

(57) ABSTRACT

Disclosed are an electrical feedthrough connector, a substrate support assembly, and a method for feeding electrical signals to a processing chamber. The electrical feedthrough connector includes a first receptacle including a first electrical socket; an interface body, and a second receptacle including a second electrical socket. The interface body includes a first side, a second side, and a solid part disposed between the first side and the second side. The first side is coupled with the first receptacle, and the second receptacle is coupled with the second side. The solid part includes a conductive path embedded in a plurality of dielectric layers; and the conductive path is configured to provide an electrical connection between the first electrical socket and the second electrical socket. The substrate support assembly includes the electrical feedthrough connector. The method utilizes the electrical feedthrough connector to provide electrical signals to electrodes of an electrostatic chuck.

20 Claims, 7 Drawing Sheets

(56) References Cited

U.S. PATENT DOCUMENTS

2022/0359255 A1 11/2022 Parkhe
2023/0068968 A1* 3/2023 Sasaki ............... H01J 37/32715

* cited by examiner

ELECTRICAL FEEDTHROUGH CONNECTOR FOR A SUBSTRATE SUPPORT ASSEMBLY

BACKGROUND

Field

Embodiments of the present disclosure generally relate to a substrate support assembly of a processing chamber, and more particularly to an electrical feedthrough connector for a substrate support assembly of a processing chamber.

Description of the Related Art

A processing chamber for processing a substrate typically has a substrate support assembly to support a substrate. The substrate support assembly contains several electrodes which will be activated during a substrate processing. For example, the substrate support assembly may have several electrodes for chucking, generating plasma, heating, and other functions. As an internal processing volume of the processing chamber is under vacuum during operation, the substrate support assembly, which forms a part of the interface between the internal volume and an external environment, also functions as a vacuum break for preventing any air leakage into the vacuumed internal volume.

To provide electrical signals into the electrodes of the substrate support assembly, which are placed in the internal volume of the processing chamber, an electrical feedthrough connector is used in the substrate support assembly. The electrical feedthrough connector not only transmits electrical signals from an external power source to the internal electrode, but also form airtight connections both within the electrical feedthrough connectors and with other parts of the substrate support assembly. Conventional vacuum electrical feedthrough connectors are formed by many parts, each of which may be individually made and then machined to form through holes or channels for electrical connections. Certain parts are made of expensive materials, such as titanium. Connecting parts, when assembled, are also brazed to form hermetic connections and improve electrical connections. As a result, it is time-consuming and expensive to make conventional electrical feedthrough connectors for a substrate support assembly.

Thus, there is a need for an improved electrical feedthrough connector for a substrate support assembly.

SUMMARY

Disclosed herein are an electrical feedthrough connector, a substrate support assembly, and a method for feeding electrical signals to an internal electrode of a processing chamber. In an embodiment, the electrical feedthrough connector includes a first receptacle including a first electrical socket; an interface body, and a second receptacle including a second electrical socket. The interface body includes a first side, a second side, and a solid part disposed between the first side and the second side. The first side is coupled with the first receptacle, and the second side is coupled with the second receptacle. The solid part includes a conductive path embedded in a dielectric material; and the conductive path is configured to provide an electrical connection between the first electrical socket and the second electrical socket.

In another embodiment, the substrate support assembly includes an electrostatic chuck having a plurality of electrodes; a utility plate disposed below the electrostatic chuck and including a cooling channel; and an electrical feedthrough connector coupled with the electrostatic chuck and the utility plate and configured to provide electrical signals to the plurality of electrodes. The electrical feedthrough connector is further configured according to various embodiments of the present disclosure.

In yet another embodiment, a method for feeding an electric signal to an internal electrode of a processing chamber is disclosed. The processing chamber includes an internal processing volume. The method includes transmitting an electric signal from an external source to a first electrical terminal of an electrical feedthrough connector of a substrate support assembly, the first electrical terminal being disposed outside of the internal processing volume; transmitting the electric signal from the first electrical terminal to a plurality of first vertical vias embedded in an interface body of the substrate support assembly; transmitting the electrical signal from the plurality of first vertical vias to a plurality of horizontal conductive traces embedded in the interface body; transmitting the electrical signal from the horizontal conductive traces to a plurality of second vertical vias embedded in the interface body; transmitting the electrical signal from the plurality of the second vertical vias to a second electrical terminal of the electrical feedthrough connector, the first electrical terminal and the second electric terminal being disposed at opposite sides of the interface body; and transmitting the electrical signal from the second electrical terminal to the internal electrode of the processing chamber, the internal electrode being disposed in the substrate support assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
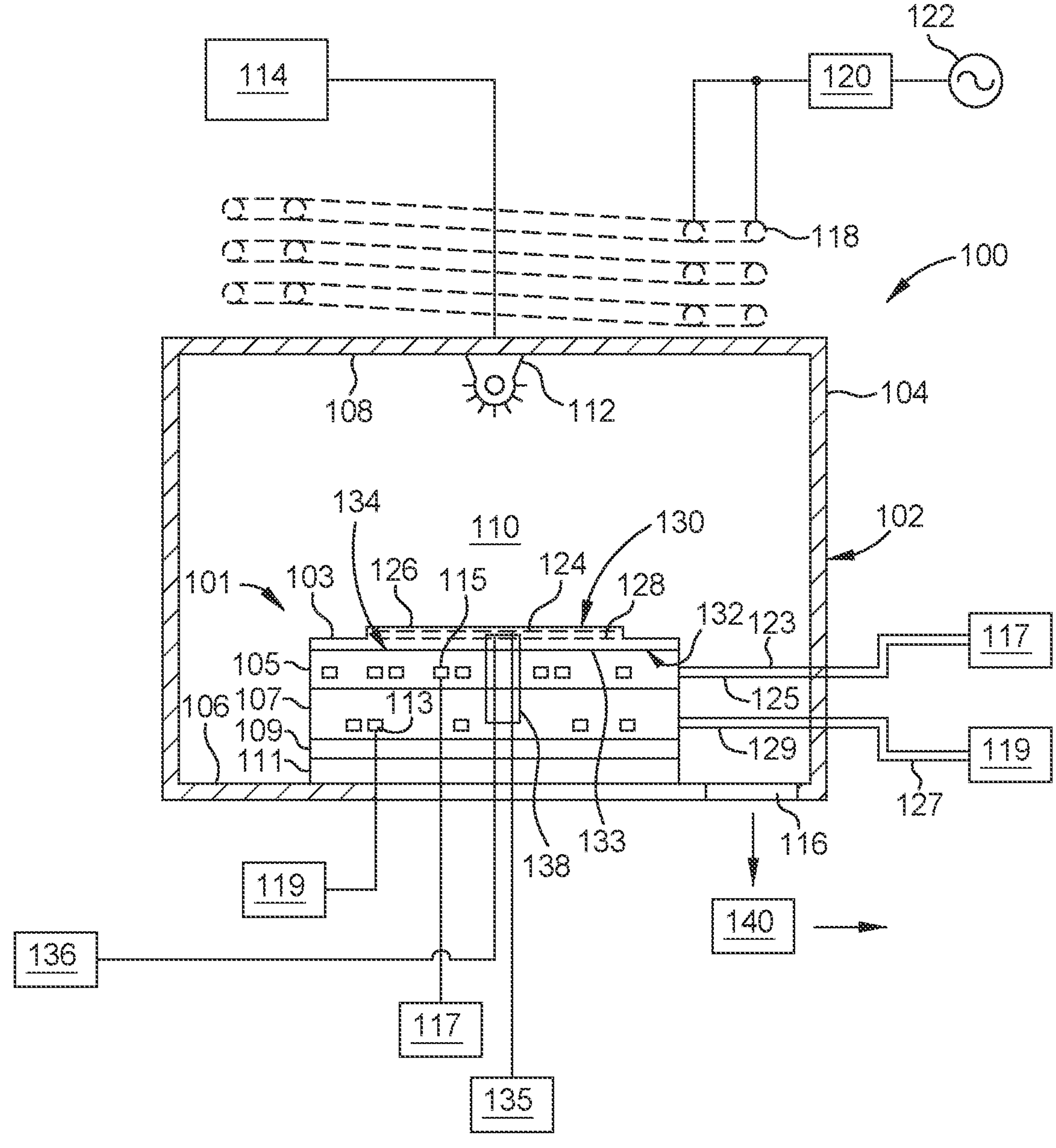
FIG. 1 illustrates a cross-sectional schematic view of a plasma processing chamber, according to an embodiment.

Embodiments described herein provide a substrate support assembly having an improved electrical feedthrough connector as set forth in various embodiments of the present disclosure. The electrical feedthrough connector includes an interface body coupled with two receptacles that are disposed at opposite sides of the interface body. The interface body includes a solid part that separates a top surface and a bottom surface of the interface body. The solid part includes conductive traces and vias embedded in a dielectric material. The conductive traces and vias are configured to provide electrical connections between the top surface and the bottom surface. The solid part includes no through-holes or through-conduits and is airtight. The two receptacles can be bonded to the interface body to provide electrical connections between the interface body and other electrodes. The electrical feedthrough connector may also include an alignment mechanism for aligning the interface body with the two receptacles.

In an embodiment, the interface body may be formed by a process similar as the process to fabricate a printed circuit board or ceramic electrostatic chuck. For example, conductive traces may be disposed among dielectric layers. Conductive vias may also be disposed within the dielectric material. The dielectric layers may be sintered or otherwise bonded together to complete the fabrication of the interface body. The conductive traces may be made of a metal, such as Mo, Ti, W, Cu, or any other suitable metals. The dielectric layers may be made of a dielectric material, such as ceramic, aluminum oxide, aluminum nitride, or any other suitable dielectric materials. In an embodiment, the dielectric material includes a polymeric material, such as a resin material (polyimide, epoxy, and other suitable resin material). Reinforcement, such as fiberglass, may be embedded in the polymeric material to improve the mechanical strength. In an embodiment, the conductive traces and vias may comprise two or more different metals. The dielectric layers may be made of two or more dielectric materials. In an embodiment, the conductive traces and vias may be replaced by a bulk conductive part embedded in dielectric layers. A bulk conductive part as used in the present disclosure refers to a conductor of such dimensions that are not typically used in a PCB process. In an embodiment, the bulk conductive part is conductive and has a thickness of at least few millimeters, such as two (2), three (3), or five (5) millimeters. In another embodiment, the bulk conductive part is made from a metal wire mesh material.

The electrical feedthrough connector as set forth in the present application can be produced in batches and by using less expensive materials. The number of machining and brazing processes are substantially reduced. As a result, the electrical feedthrough connector of the present disclosure and the substrate support assembly having such an electrical feedthrough connector can be more economically made.

FIG. 1 illustrates a schematic cross-sectional view of a processing chamber 100, according to an embodiment. The processing chamber 100 includes an electrical feedthrough connector 138 disposed in a substrate support assembly 101, as set forth according to various embodiments of the present disclosure. The processing chamber 100 is configured to generate a plasma for processing a substrate 124. The substrate support assembly 101 may be utilized in other plasma processing chambers, for example plasma treatment chambers, annealing chambers, physical vapor deposition chambers, chemical vapor deposition chambers, and ion implantation chambers.

The plasma processing chamber 100 includes a chamber body 102 having sidewalls 104, a bottom 106 and a lid 108 that enclose an internal volume 110. An injection apparatus 112 is coupled to the sidewalls 104 and/or lid 108 of the chamber body 102. A gas panel 114 is coupled to the injection apparatus 112 to allow process gases to be provided into the internal volume 110. The injection apparatus 112 may include one or more nozzles, inlet ports, or a showerhead. Process gases, along with any processing by-products, are removed from the internal volume 110 through an exhaust port 116 formed in the sidewalls 104 or bottom 106 of the chamber body 102. The exhaust port 116 is coupled to a pumping system 140, which includes throttle valves and pumps utilized to control the vacuum levels within the internal volume 110. Processing by-products are also removed through the exhaust port 116 using the pumping system 140.

The process gases may be energized to form a plasma within the internal volume 110. The process gases may be energized by capacitively or inductively coupling RF power to the process gases. In one embodiment, which can be combined with other embodiments described herein, depicted in FIG. 1, a plurality of coils 118 are disposed above the lid 108 of the processing chamber 100 to form a plasma in the internal volume 110. The coils 118 is coupled to an RF power source 122 via an RF matching circuit.

The substrate support assembly 101 is disposed in the internal volume 110 below the injection apparatus 112. The substrate support assembly 101 includes an electrostatic chuck (ESC) 103 and an ESC base assembly 105. The ESC base assembly 105 is coupled to the ESC 103 and a facility plate 107. The facility plate 107, supported by a ground plate 111, is configured to facilitate electrical, cooling, heating, and gas connections with the substrate support assembly 101. The ground plate 111 is supported by the bottom 106 of the processing chamber. A dielectric plate 109 electrically insulates the facility plate 107 from the ground plate 111. An electrical feedthrough connector 138 is disposed in the substrate support assembly to transmit electrical signals to the electrodes of the ESC 103.

The ESC 103 has a support surface 130 and a bottom surface 132 opposite the support surface 130. In one embodiment, the ESC 103 is fabricated from a ceramic material, such as alumina ($Al_2O_3$), aluminum nitride (AlN) or other suitable material. Alternatively, the ESC 103 may be fabricated from a polymer, such as polyimide, polyetheretherketone, polyaryletherketone, and the like.

The ESC 103 includes a chucking electrode 126 disposed therein. The chucking electrode 126 may be configured as a mono polar or bipolar electrode, or other suitable arrangement. The chucking electrode 126 is coupled to a chucking power source 135, which provides a DC power to electrostatically secure the substrate 124 to the support surface 130 of the ESC 103. RF filters may be placed between the chucking electrode and the chucking power source to prevent RF power from damaging electrical equipment or presenting an electrical hazard outside the chamber.

The ESC 103 includes one or more heating electrodes 128 embedded therein. The heating electrodes 128 are utilized to control the temperature of the ESC 103, which is cooled by the ESC base assembly 105, such that processing temperatures suitable for processing a substrate 124 disposed on the support surface 130 of the substrate support assembly 101 may be maintained. The heating electrodes 128 may be resistive heater and are coupled to a heater power source 136. The heater power source 136 may provide 500 watts or more power to the heating electrodes 128. The heating electrodes 128 maintain the substrate 124 at a temperature suitable for processing. The operational temperature range is between about −250 degrees Celsius and about 400 degrees Celsius. For example, the operational temperature range is between about −200 degrees Celsius and about 350 degrees Celsius.

In an embodiment, the electrical feedthrough connector 138 is disposed in the substrate support assembly 101 to provide power from external power sources to the heating electrodes 128 and the chucking electrodes 126. In addition to function as an electrical feedthrough, the electrical feedthrough connector 138 also functions as a vacuum break to prevent air leakage into the processing chamber 100.

The ESC base assembly 105 includes a base channel 115 fluidly coupled to a coolant source 117. The coolant source 117 provides a coolant, such as a refrigerant, to the base channel 115 so that the ESC base assembly 105, and consequently, the substrate 124, may be maintained at a predetermined temperature. Similarly, the facility plate 107 includes a facility channel 113 fluidly coupled to a heating fluid source 119. The heating fluid source 119 provides facility fluid to the facility channel 113 so that the facility plate 107 is maintained a predetermined temperature. The heating fluid source 119 contains a heat exchange fluid that maintains the facility plate 107 at a temperature at or near ambient temperatures.

A bond layer 133 is provided at an interface between the bottom surface 132 of the ESC 103 and a top surface 134 of the ESC base assembly 105. The ESC 103 may be made of alumina ($Al_2O_3$) or aluminum nitride (AlN). The ESC base assembly 105 may be made of aluminum (Al), molybdenum (Mo), a ceramic, or combinations thereof. The bond layer 133 allows strain to be absorbed due to small differences in the CTE of the ESC 103 and ESC base assembly 105 from temperatures of about 90 degrees Celsius to about −200 degrees Celsius during operation.

Figure 2:
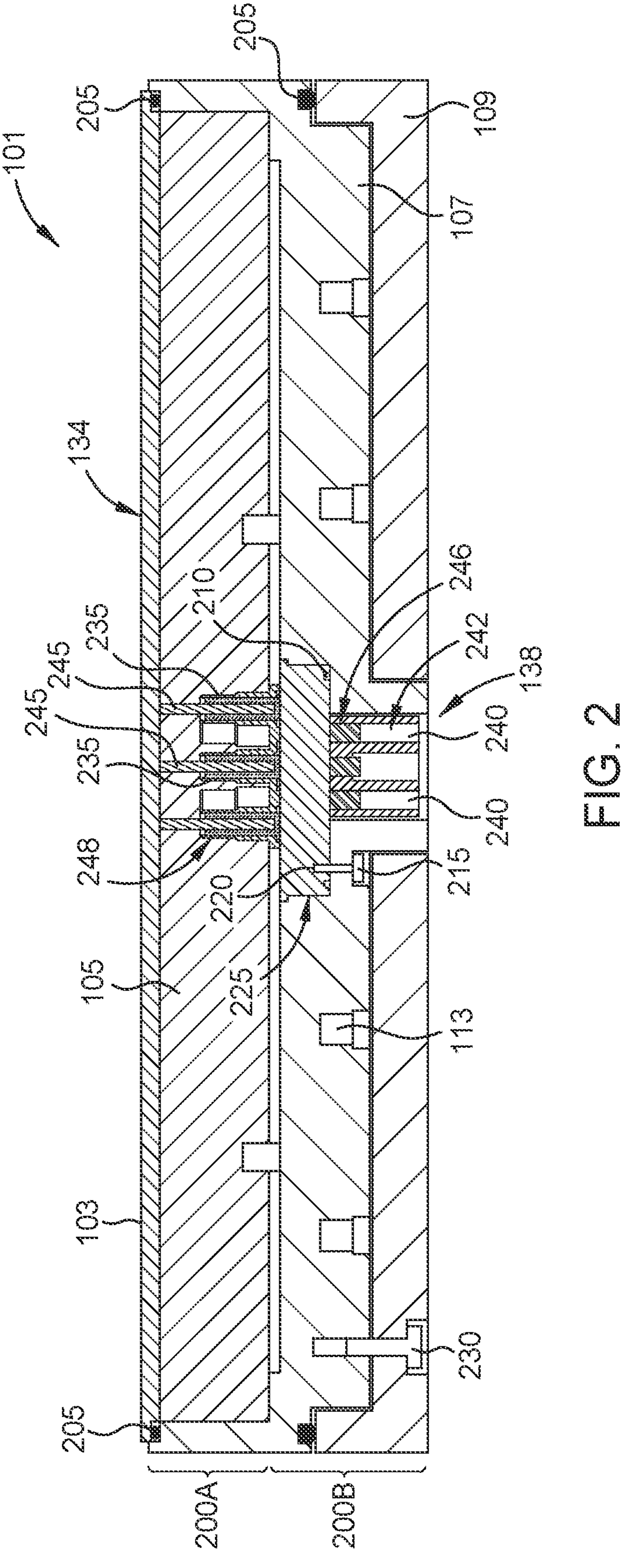
FIG. 2 illustrates a schematic cross-sectional view of a substrate support assembly, according to an embodiment.

FIG. 2 illustrates a schematic cross-sectional view of a substrate support assembly 101 having an electrical feedthrough connector 138, according to an embodiment. In an embodiment, the electrical feedthrough connector 138 is positioned in a geometric center of the substrate support assembly 101. It is contemplated that the electrical feedthrough connector 138 may be positioned in another suitable locations. The substrate support assembly 101 is generally divided into two zones, such as a first zone 200A and a second zone 200B. The first zone 200A and the second zone 200B are characterized as different pressure regions. For example during processing of the substrate, the first zone 200A is located in the internal volume 110 and is maintained at negative or vacuum pressures. The second zone 200B is separated from the internal volume 110 by the first zone 200A and is maintained at or near atmospheric or ambient pressures. Seals 205 are disposed at any contact areas or gaps that could cause leakage between the zones 200A, 200B and the ambient environment. In another embodiment, the first zone 200A and the second zone 200B are characterized as different temperature regions, which may or may not be also characterized as different pressure regions.

The electrical feedthrough connector 138, due to the electrical feedthroughs, may have the possibility to cause air leakage. Thus, the electrical feedthrough connector 138 is also configured to function as a vacuum break in one aspect to maintain the pressures differences between the first zone 200A and the second zone 200B. Seals 210 are disposed at any contact areas or gaps between the electrical feedthrough connectors and other parts of the substrate support assembly. For example, seals 210 are disposed between the facility plate 107 and the electrical feedthrough connector 138 to maintain isolation of the pressures within the first zone 200A. The seal 210 may be any suitable seal or gasket, such as an O-ring type, cup seal, lip seal, or gasket, among others. The seal 210 made fabricated from a polymeric material, elastomeric material or other suitable material.

In an embodiment, the electrical feedthrough connector 138 may include an interface body 225 coupled with an upper receptacle 248 and a lower receptacle 246. The interface body 225 includes a solid part having a conductive path embedded in dielectric layers and extending between side surfaces of the interface body 225. In an embodiment, the solid part does not have any through holes or conduits, thus being airtight. The conductive path is configured to connect the upper receptacle 248 and the lower receptacle 246. The upper receptacle 248 includes a plurality of sockets 235 configured to couple with pins 245. The pins 245 are coupled with various electrodes of the ESC 103. The lower receptacle 246 includes a plurality of sockets 242 configured to couple with pins 240. The pins 240 are coupled with various power sources for the various electrodes in the ESC 103. In an embodiment, the pins 245 and the pins 240 are connected via the conductive path embedded in the interface body 225. A more detailed description of the electrical feedthrough connector 138 will be provided later with reference to FIGS. 3A through 3C.

The electrical feedthrough connector 138 is coupled to the ESC base assembly 105 by a plurality of fasteners 215 (only one is shown in this view), such as a screw or bolt. Each fastener 215 is received in a threaded hole 220 formed in the interface body 225. The dielectric plate 109 is coupled to the facility plate 107 by one or more fasteners 230 (only one is shown in this view), such as a screw or bolt.

Figure 3A:
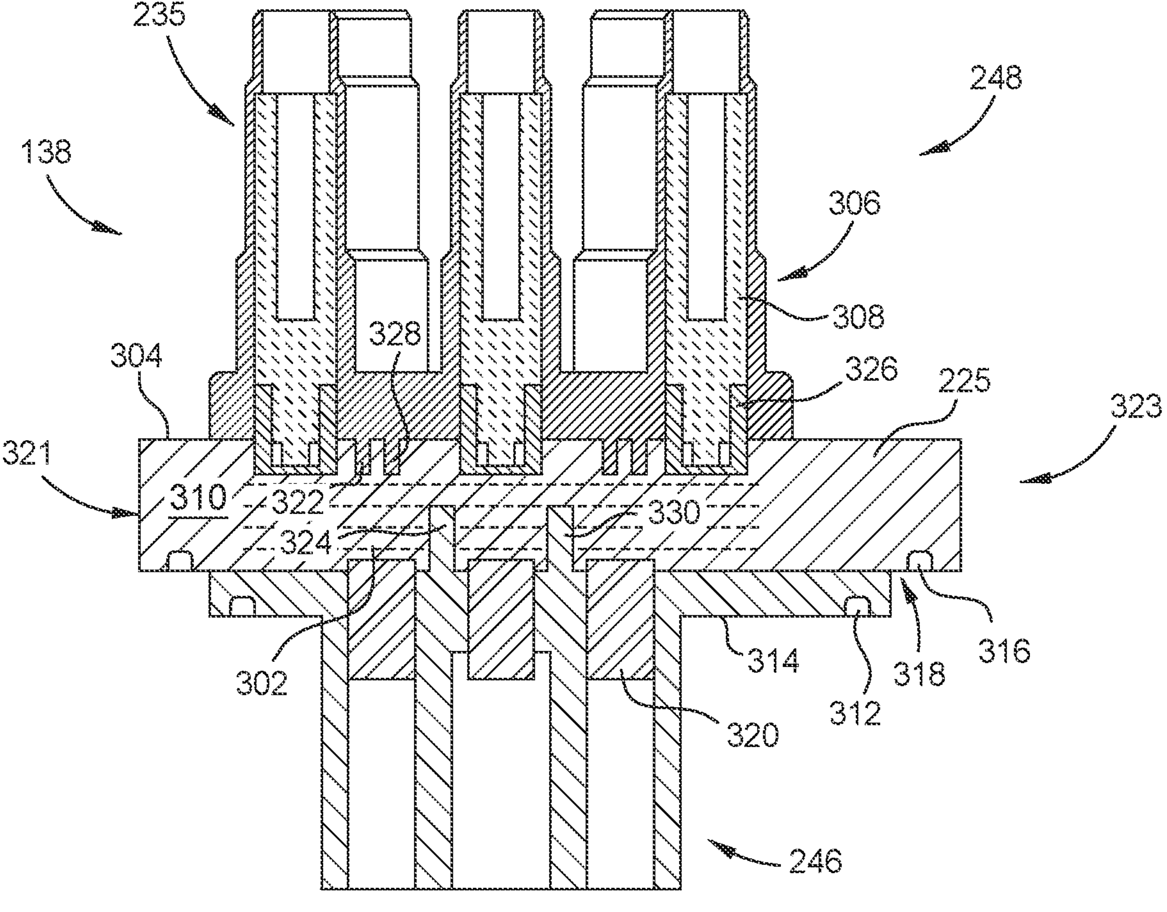
FIG. 3*a* illustrates a schematic cross-sectional view of an electrical feedthrough connector, according to an embodiment.

FIG. 3A illustrates a schematic cross-sectional view of the electrical feedthrough connector 138, according to an embodiment. The electrical feedthrough connector 138 includes an upper receptacle 248, an interface body 225, and a lower receptacle 246 opposing the upper receptacle 248. The upper receptacle 248 includes a plurality of sockets 235, such as nine (9) sockets, each having an electric terminal 308 enclosed by an insulator housing 306. The socket 235 may also include a brazed metal contact 326 configured to couple the electrical terminal 308 with the interface body 225.

The lower receptacle 246 may include the same number of sockets as the upper receptacle 248. In an embodiment, sockets 320 of the lower receptacle 246 may be similarly configured as sockets 235 of the upper receptacle 248. In an embodiment, the sockets 235 of upper receptacle 248 and the sockets 320 of the lower receptacle 246 are electrically connected by the interface body 225. In an embodiment, each socket 235 in the upper receptacle is paired with a single socket 320 of the lower receptacle for supplying electrical signals to one electrode of the ESC 103.

The interface body 225 includes a conductive path 302 that couples the upper receptacle 248 and the lower receptacle 246. To provide an electric feedthrough, the conductive path 302 includes a plurality of conductive traces disposed substantially horizontally and a plurality of conductive vias disposed substantially vertically (shown in FIG. 3B). In an embodiment, the interface body 225 is formed by embedding conductive traces in dielectric layers and sintering the dielectric layers around the conductive traces to form a solid piece. The plurality of conductive traces and vias are placed in the interface body 225 at socket locations in the upper receptacle 248 and the lower receptacle 246. The conductive traces may be made of a metal, such as Mo, Ti, W, Cu, or any other suitable metals. The dielectric layer may be made of a dielectric material, such as ceramic, aluminum oxide, aluminum nitride, or any other suitable dielectric materials. In an embodiment, the dielectric material includes a polymeric material, such as a resin material (polyimide, epoxy, and other suitable resin material). Reinforcement, such as fiberglass, may be embedded in the polymeric material to improve the mechanical strength.

To form a vacuum break, the interface body 225 includes a solid part 310 that extends from one side surface 321 of the interface body 225 to another side surface 323. The solid part 310 has no through holes or conduits. In an embodiment, the solid part 310 is formed when the dielectric layers are sintered or otherwise bonded together around the conductive traces and vias. The solid part 310 may include a flange portion 304 that extends beyond the foot print of the upper receptacle and the lower receptacle. The flange portion 304 is configured to form airtight contact with other parts of the substrate support assembly 101.

In an embodiment, an alignment mechanism is provided in the electrical feedthrough connector 138 to ease the assembling process. As shown in FIG. 3A, the interface body 225 may include a plurality of depressions or blind holes 322 disposed at predetermined locations on the upper side of the interface body 225. The upper receptacle 248 may include a plurality of alignment protrusions 328 configured to engage with the blind holes 322. In an embodiment, the blind holes 322 and alignment protrusions 238 may be disposed symmetrically around a socket 235. For example, each socket 235 may have two alignment protrusions disposed along a diagonal direction of a socket 235.

The interface body 225 may include a plurality of blind holes 324 disposed at predetermined locations on the lower side of the interface body 225. Similar to the upper receptacle 248, the lower receptacle 246 may include a plurality of protrusions 330 that are configured to engage with the blind holes 324.

Each of the upper receptacle 248 and the lower receptacle 246 may be fabricated from dielectric materials to electrically insulate the electric terminals 308 disposed therein. In one example, the upper receptacle 248 is fabricated from a polymer material, such as thermoplastic material, for example a polyether ether ketone (PEEK) material. The lower receptacle 246 may be fabricated from the same material as the upper receptacle 248. In another example, the lower receptacle 246 is fabricated from a different material from the upper receptacle 248, such as a high dielectric constant material including a ceramic material, aluminum oxide, or any other suitable materials.

The electrical feedthrough connector 138 may include a plurality of seal grooves configured to hold seals. For example, a first seal groove 312 for receiving a first seal is formed in a lower surface 314 of the lower receptacle 246. A second seal groove 316 for receiving a second seal is formed in a lower surface 318 of the interface body 225. In an embodiment, the first seal groove 312 is disposed below the second seal groove 316. The first seal groove 312 and the second seal groove 316 are configured to hold seals disposed between the electrical feedthrough connector 138 and the utility plate 107.

Figure 3B:
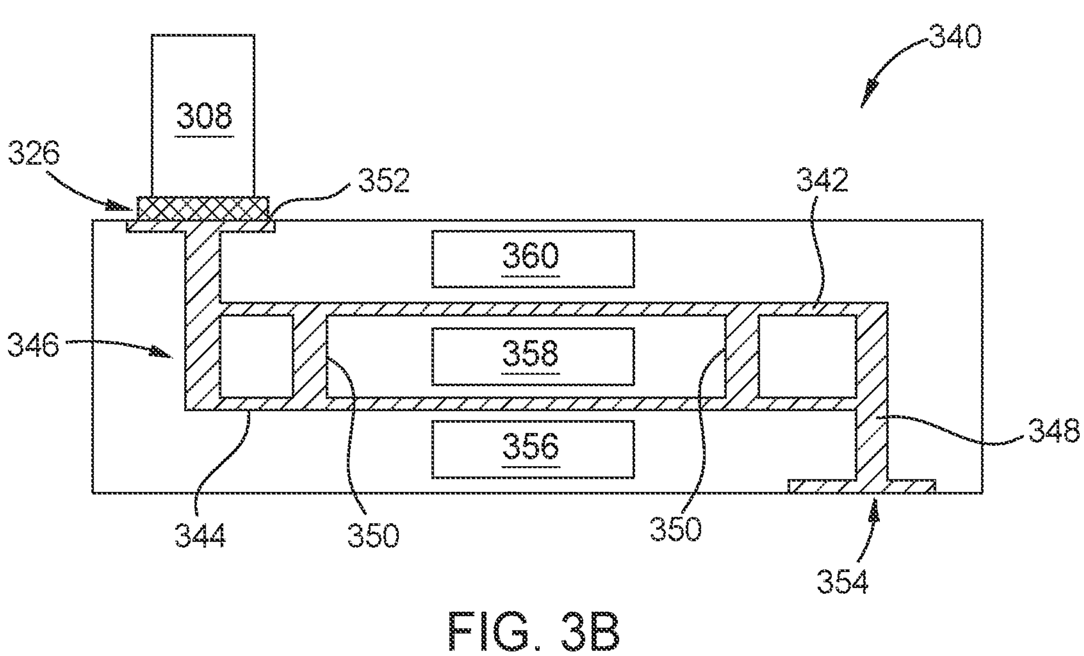
FIG. 3*b* illustrates a schematic cross-sectional view of an interface body of the electrical feedthrough connector, according to an embodiment.

FIG. 3B illustrates a schematic configuration of a conductive path 340 in the interface body 225, according to an embodiment. The conductive path 340 includes a plurality of horizontal conductive traces 342, 344, a plurality of conductive vias 346, 348, 350, and a plurality of bond pads 352, 354. The conductive path 340 is embedded in a plurality of dielectric layers 356, 358, 360. The bond pad 352 may be coupled with the electrical terminal 308 of the upper receptacle 248 via a brazed connection 326. The bond pad 354 may also be brazed and coupled with the electrical terminal of the lower receptacle 246. The bond pad 352 is coupled with the via 346, which is coupled with the plurality of conductive traces 344, 342. The via 346 is configured to transmit electrical signals from the traces 344 and 342 to the bond pad 352. The bond pad 354 is coupled with the via 348 which is coupled with the plurality of traces 344 and 342. The via 348 is configured to transmit electrical signals from the bond pad 354 to the traces 344, 342. The vias 350 couple with the metal traces 342, 344 and are configured to balance the electrical loads among the metal traces 342, 344. The vias 350 are isolated by the dielectric layers from external contacts. As the upper receptacle 248 and the lower receptacle 248 have different form factors, the paired sockets in the upper receptacle 248 and the lower socket 242 are often misaligned horizontally. Thus, the conductive traces 342 and 344 are configured to transmit electrical signal horizontally between the two pair sockets. The number of conductive traces are not limited to two (2) and may be one (1), three (3), four (4), or even higher numbers.

FIG. 3B also illustrates a plurality of dielectric layers 356, 358, and 360. The dielectric layers 356, 358, and 360 may be made of the same dielectric material or different dielectric materials. The dielectric layer 356 may be disposed at the bottom to isolate the trace 344 from external contacts. The dielectric layer 358 is disposed between adjacent traces 342 and 344. The dielectric layer 360 is disposed at the top to isolate the trace 342 from external contacts. In an embodiment, the dielectric layers 356, 358, 360 are made of ceramic. After the traces 342, 344 and the dielectric layers 356, 358, 360 are properly placed, a sintering process can be applied to bond the dielectric layers and the traces together to form a solid piece. In an embodiment, the thickness of a conductive trace may be less than 2 mm or less than 1 mm or about 10-15 um.

Figure 3C:
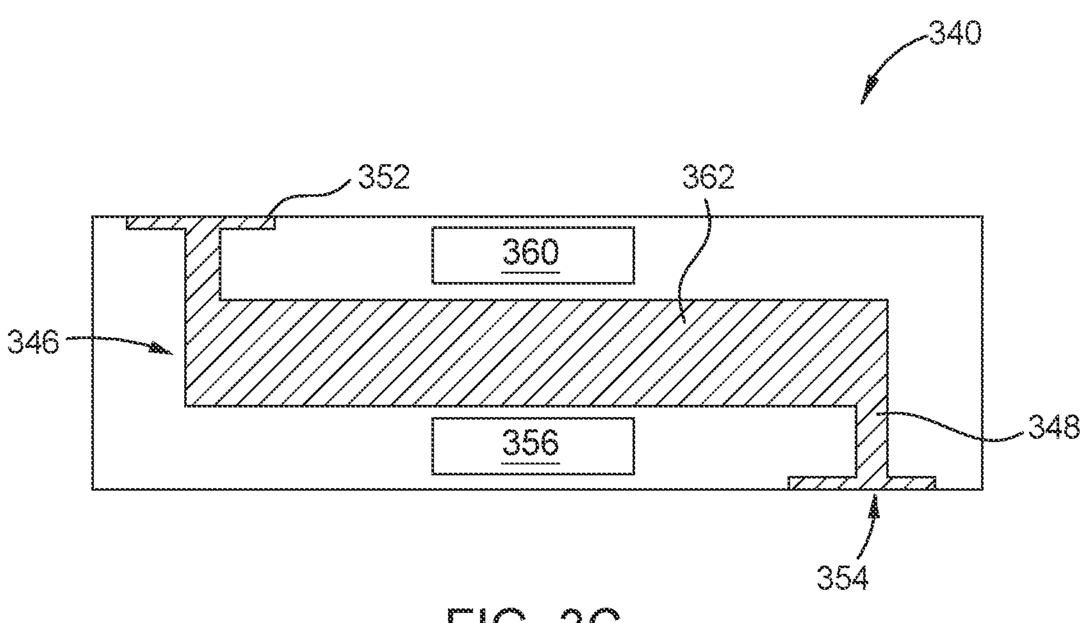
FIG. 3*c* illustrates a schematic cross-sectional view of the interface body, according to an embodiment.

FIG. 3C illustrates a schematic cross-sectional view of the interface body, according to an embodiment. In this example, the conductive traces 344, 342 may be replaced by a bulk conductive part 362. The conductive vias 346 and 348 and bond pads 352 and 354 are coupled with the bulk conductive part 362. Two dielectric layers 356 and 360 enclose the bulk conductive part 362 from the bottom and the top, respectively. After a sintering process is applied, the bulk conductive part 362 and the dielectric layers 356, 360 also form a solid piece.

Figure 4:
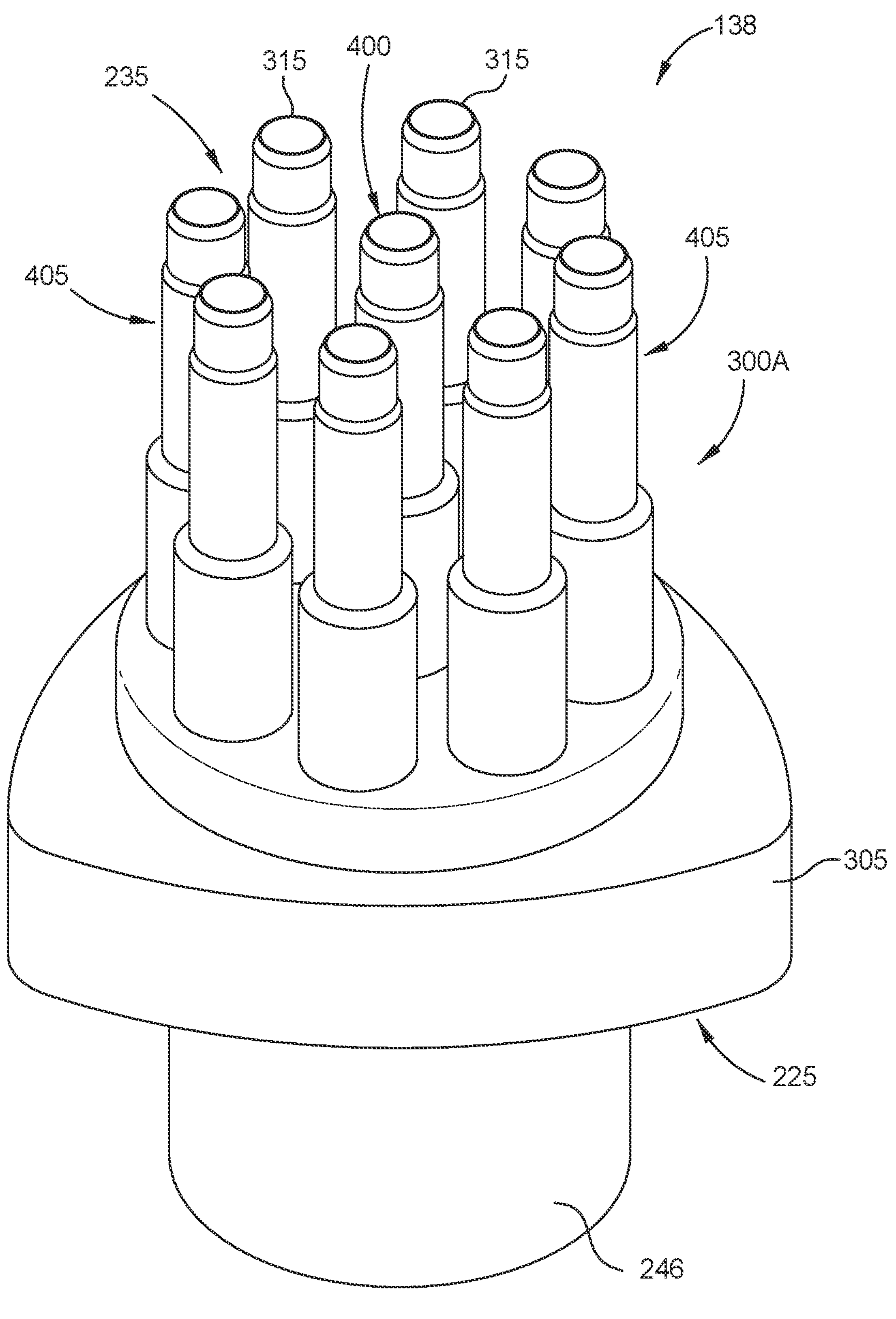
FIG. 4 illustrates a schematic perspective view of the electrical feedthrough connector, according to an embodiment.

FIG. 4 illustrates a schematic perspective view of the electrical feedthrough connector 138, according to an embodiment. As shown in FIG. 4, the upper receptacle 248 includes a central socket 400 surrounded by a plurality of peripheral sockets 405. In an embodiment, the upper receptacle 248 includes nine (9) sockets, including one (1) center socket and eight (8) peripheral sockets. Each of the central socket 400 and the peripheral socket 405 is disposed in a separate electrical path. An electrical terminal 315 is disposed in each of the sockets 400 and 405. Thus, nine (9) separate electrical paths are formed by the sockets shown in FIG. 5. In an embodiment, the lower receptacle 246 may be similarly configured as the upper receptacle 248.

In one example, the electrical feedthrough connector 138 is operable to conduct up to about 25 amps of current during operation at a temperature range of about 25 degrees Celsius to at least about −90 degrees Celsius. For example, the electrical feedthrough connector 138 can operate at a temperature range of at least 15 degrees to at least −90 degrees Celsius. The electrical feedthrough connector 138 provides a voltage standoff (breakdown voltage) of at least about 7 kilovolts (kV) between the various electrical paths as well as between the electrical paths and the interface bodies (e.g., upper receptacle 248, lower receptacle 246 and interface body 225). This reduces the potential for arcing within the substrate support assembly 101. The electrical feedthrough connector 138 provides suitable vacuum sealing down to and including pressures of about $10^{-3}$ Torr (e.g., about 0.0001934 pounds per square inch (psi)) during operation, including at low operation temperatures. Further, the electrical feedthrough connector 138 provides an electrical and sealing interface during operation including the above using a polymer or elastomeric seal 210.

Figure 5:
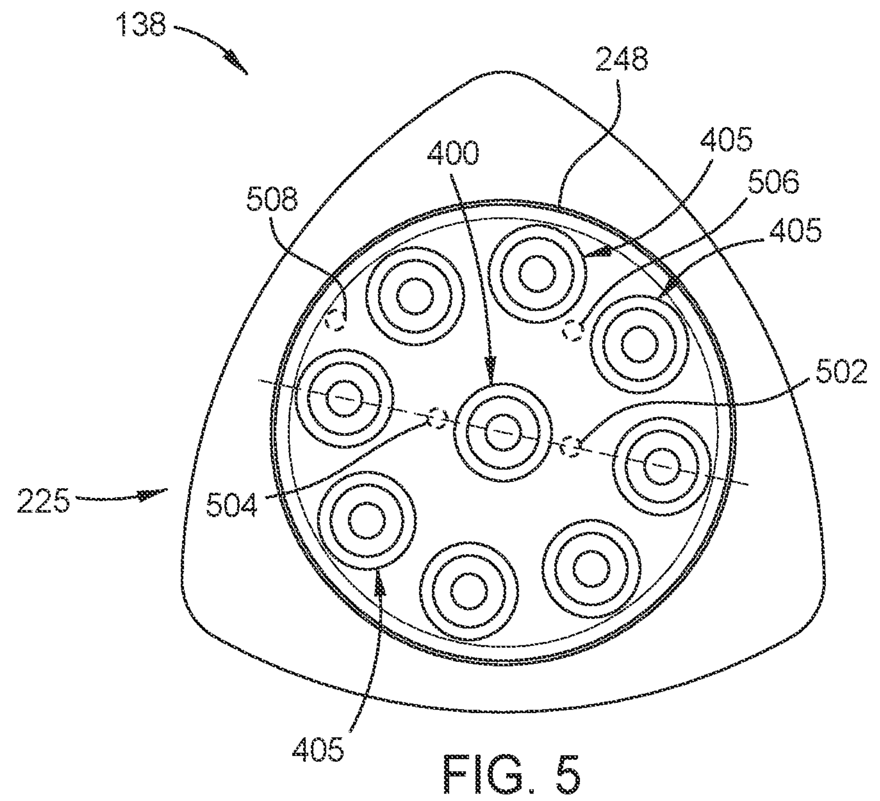
FIG. 5 illustrates a schematic top view of the electrical feedthrough connector, according to an embodiment.

FIG. 5 illustrates a schematic top view of the electrical feedthrough connector 138, according to an embodiment. The alignment mechanism is shown in FIG. 5. For example, the central socket 400 may have two alignment protrusions 502 and 504 disposed along a diagonal direction of the socket 400. The peripheral socket 405 may include alignment protrusions disposed at various locations. A first protrusion 506 may be disposed between adjacent peripheral sockets 405. A second protrusion 508 may be disposed around the perimeter of the upper receptacle 248.

Figure 6:
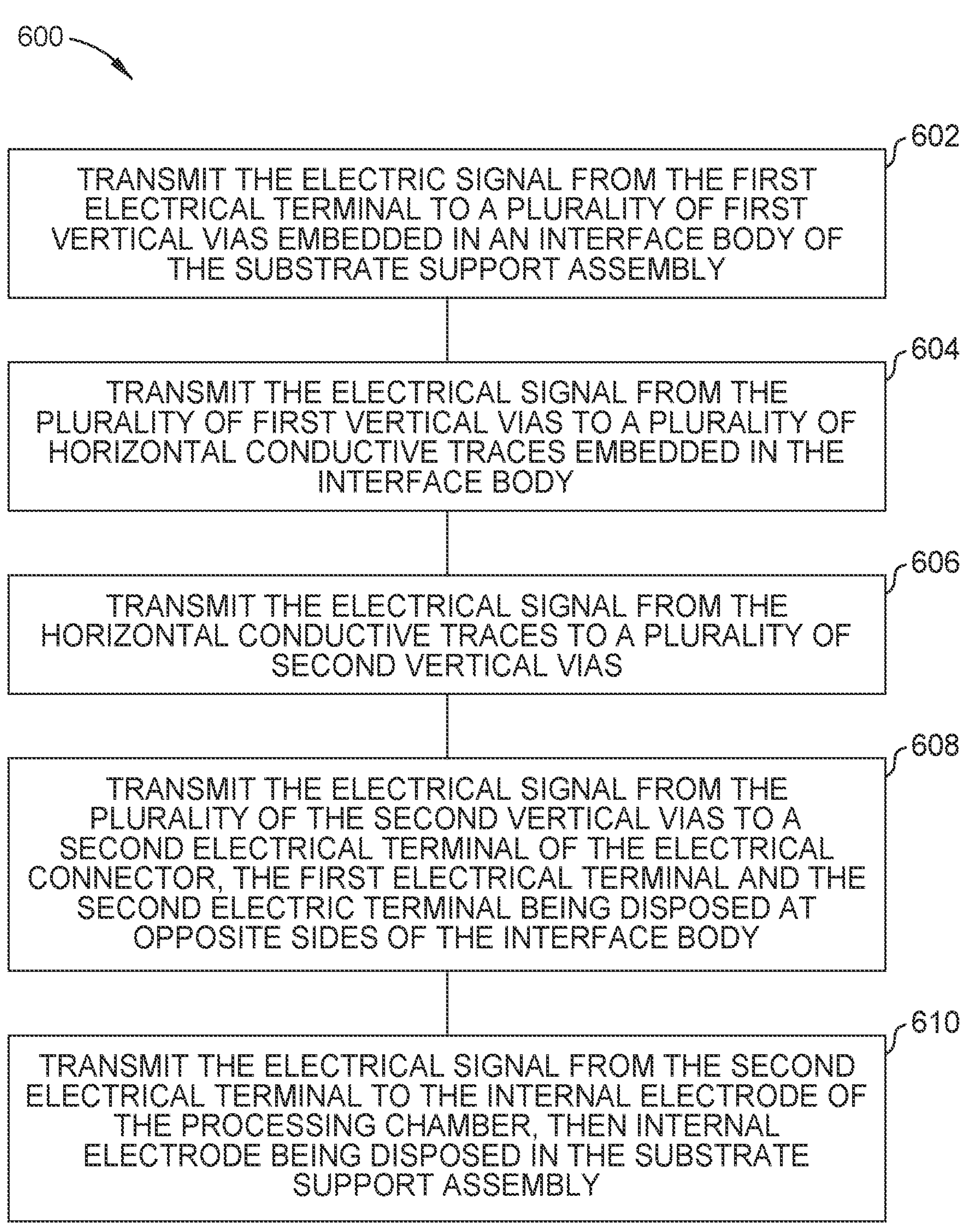
FIG. 6 illustrates a method for providing electrical signals from an external source to an internal electrode of a processing chamber, according to an embodiment.

FIG. 6 illustrates a method 600 for feeding electric signals from an external power source to an internal electrode of a processing chamber, according to an embodiment. The processing chamber 100 has an internal processing volume in which a substrate support assembly 101 is disposed. The internal electrode is disposed in an electrostatic chuck 103 of the substrate support assembly. The substrate support assembly 101 includes an electrical feedthrough connector 138 as set forth in various embodiments of the present disclosure and is configured to feed electrical signals from external power sources to the internal electrode.

At operation 602, an electrical signal is transmitted from an external power source to a first electrical terminal of the electrical feedthrough connector. At operation 604, the electric signal is transmitted from the first electrical terminal to a plurality of first vertical vias embedded in an interface body of the substrate support assembly. At operation 604, the electrical signal is transmitted from the plurality of first vertical vias to a plurality of horizontal conductive traces embedded in the interface body. At operation 606, the electrical signal is transmitted from the horizontal conductive traces to a plurality of second vertical vias. At operation 608, the electrical signal is transmitted from the plurality of the second vertical vias to a second electrical terminal of the electrical feedthrough connector, the first electrical terminal and the second electric terminal being disposed at opposite sides of the interface body. At operation 610, the electrical signal is transmitted from the second electrical terminal to the internal electrode of the processing chamber, the internal electrode being disposed in the substrate support assembly.

It is contemplated that one or more aspects disclosed herein may be combined. Moreover, it is contemplated that one or more aspects disclosed herein may include some or all of the aforementioned benefits. While the foregoing is directed to embodiments of the present disclosure, other and further embodiments of the disclosure may be devised without departing from the basic scope thereof, and the scope thereof is determined by the claims that follow.

What is claimed is:

1. An electrical feedthrough connector comprising:

a first receptacle comprising a first electrical socket;

an interface body comprising a first side, a second side, and a solid part disposed between the first side and the second side, the first side coupled with the first receptacle, wherein a conductive path is encapsulated in the solid part; and a second receptacle coupled with the second side of the interface body and comprising a second electrical socket, wherein the conductive path is configured to provide an electrical connection between the first electrical socket and the second electrical socket.

2. The electrical feedthrough connector of claim 1, wherein the conductive path comprises a bulk conductive part encapsulated in the solid part, and the solid part comprising a plurality of dielectric layers.

3. The electrical feedthrough connector of claim 1, wherein the conductive path comprises a plurality of conductive traces disposed substantially horizontally coupled with a plurality of conductive vias disposed substantially vertically.

4. The electrical feedthrough connector of claim 2, wherein the conductive path comprises two adjacent conductive traces separated by a dielectric layer.

5. The electrical feedthrough connector of claim 4, wherein the plurality of dielectric layers are made of a single dielectric material or different dielectric materials.

6. The electrical feedthrough connector of claim 1, wherein the conductive path comprises a first bond pad disposed at the first side of the interface body and configured to couple with the first electrical socket and a first conductive via.

7. The electrical feedthrough connector of claim 6, wherein the conductive path comprises a second bond pad disposed at the second side of the interface body and configured to couple with the second electrical socket and a second conductive via.

8. The electrical feedthrough connector of claim 1, wherein the first side comprises a first blind hole disposed adjacent to the first electrical socket and configured to align the first receptacle with the interface body.

9. The electrical feedthrough connector of claim 8, wherein the first receptacle comprises a first protrusion configured to engage with the first blind hole.

10. The electrical feedthrough connector of claim 8, wherein the second side comprises a second blind hole disposed adjacent to the second electrical socket and configured to align the second receptacle with the interface body.

11. The electrical feedthrough connector of claim 10, wherein the second receptacle comprises a second protrusion configured to engage with the second blind hole.

12. The electrical feedthrough connector of claim 1, wherein the interface body comprises a flange portion having a larger dimension than the first receptacle and comprising a seal groove.

13. The electrical feedthrough connector of claim 1, wherein the solid part is devoid of any through holes.

14. The electrical feedthrough connector of claim 1, wherein the solid part extends from one side surface of the interface body to another side surface of the interface body.

15. A substrate support assembly for a substrate processing chamber, the substrate support assembly comprising:

an electrostatic chuck having a plurality of electrodes;

a utility plate disposed below the electrostatic chuck and comprising a utility channel; and an electrical feedthrough connector coupled with the electrostatic chuck and the utility plate and configured to provide electrical feedthrough for the plurality of the electrodes, wherein the electrical feedthrough connector comprises:

a first receptacle comprising a first electrical socket;

an interface body comprising a first side, a second side, and a solid part disposed between the first side and the second side, the first side coupled with the first receptacle, wherein a conductive path is encapsulated in the solid part; and a second receptacle coupled with the second side of the interface body and comprising a second electrical socket; and wherein the conductive path is configured to provide electrical connection between the first electrical socket and the second electrical socket.

16. The substrate support assembly of claim 15, wherein the first receptacle is coupled with the plurality of the electrodes.

17. The substrate support assembly of claim 15, wherein the conductive path comprises a plurality of conductive traces disposed substantially horizontally coupled with a plurality of conductive vias disposed substantially vertically.

18. The substrate support assembly of claim 17, wherein the conductive path comprises two adjacent conductive traces separated by a dielectric layer.

19. The substrate support assembly of claim 18, wherein the solid part is devoid of any through holes.

20. A method for feeding an electrical signal from an external source to an internal electrode of a processing chamber, the method comprising:

transmitting an electrical signal from the external source to a first electrical terminal of an electrical feedthrough connector of a substrate support assembly, the processing chamber comprising an internal processing volume and the first electrical terminal being disposed outside of the internal processing volume;

transmitting the electrical signal from the first electrical terminal to a plurality of first vertical vias embedded in an interface body of the electrical feedthrough connector;

transmitting the electrical signal from the plurality of first vertical vias to a plurality of horizontal conductive traces encapsulated in the interface body;

transmitting the electrical signal from the horizontal conductive traces to a plurality of second vertical vias encapsulated in the interface body;

transmitting the electrical signal from the plurality of the second vertical vias to a second electrical terminal of the electrical feedthrough connector, the first electrical terminal and the second electric terminal being disposed at opposite sides of the interface body; and transmitting the electrical signal from the second electrical terminal to the internal electrode of the processing chamber, the internal electrode being disposed in the substrate support assembly.

* * * * *